(12) United States Patent
Futagawa et al.

(10) Patent No.: US 8,891,568 B2
(45) Date of Patent: Nov. 18, 2014

(54) LASER DIODE DEVICE AND METHOD OF MANUFACTURING LASER DIODE DEVICE

(71) Applicants: Sony Corporation, Tokyo (JP); Sumitomo Electric Industries, Ltd., Osaka (JP)

(72) Inventors: Noriyuki Futagawa, Kanagawa (JP); Hiroshi Nakajima, Kanagawa (JP); Katsunori Yanashima, Kanagawa (JP); Takashi Kyono, Osaka (JP); Masahiro Adachi, Osaka (JP)

(73) Assignees: Sony Corporation, Tokyo (JP); Sumitomo Electric Industries, Inc., Osaka (JP)

( * ) Notice: Subject to any disclaimer, the term of this patent is extended or adjusted under 35 U.S.C. 154(b) by 0 days.

(21) Appl. No.: 13/707,911

(22) Filed: Dec. 7, 2012

(65) Prior Publication Data

US 2013/0156060 A1 Jun. 20, 2013

(30) Foreign Application Priority Data

Dec. 15, 2011 (JP) ................................. 2011-274256

(51) Int. Cl.

| | | |
|---|---|---|
| *H01S 5/00* | (2006.01) | |
| *H01S 5/22* | (2006.01) | |
| *H01S 5/042* | (2006.01) | |
| *H01S 5/343* | (2006.01) | |
| *H01S 5/32* | (2006.01) | |
| *H01S 5/20* | (2006.01) | |

(52) U.S. Cl.
CPC .......... *H01S 5/2206* (2013.01); *H01S 2301/176* (2013.01); *H01S 5/22* (2013.01); *H01S 5/0425* (2013.01); *H01S 5/2009* (2013.01); *H01S 5/34333* (2013.01); *H01S 5/3202* (2013.01)
USPC .................. 372/43.01; 372/44.01; 372/45.01; 372/46.01

(58) Field of Classification Search
CPC ........... H01S 5/00; H01S 5/02; H01S 5/0218; H01S 5/042; H01S 5/0421; H01S 5/0425; H01S 5/20; H01S 5/22; H01S 5/2211; H01S 5/2214

USPC ................................. 372/43.01, 44.01, 45.01
See application file for complete search history.

(56) References Cited

U.S. PATENT DOCUMENTS

2009/0323746 A1* 12/2009 Ohmi et al. ................ 372/43.01
2010/0025657 A1*  2/2010 Nagahama et al. ............ 257/13

FOREIGN PATENT DOCUMENTS

| JP | 2010-114430 | 5/2010 |
|---|---|---|
| JP | 2011-049364 | 3/2011 |
| JP | 2011-159771 | 8/2011 |
| JP | 2011-187579 | 9/2011 |

OTHER PUBLICATIONS

Japanese Office Action issued Jul. 2, 2013 for corresponding Japanese Appln. No. 2011-274256.

* cited by examiner

*Primary Examiner* — Dung Nguyen
(74) *Attorney, Agent, or Firm* — K&L Gates LLP

(57) ABSTRACT

A laser diode device includes: a semiconductor substrate including a semi-polar surface, the semiconductor substrate being formed of a hexagonal III-nitride semiconductor; an epitaxial layer including a light emitting layer, the epitaxial layer being formed on the semi-polar surface of the semiconductor substrate, and the epitaxial layer including a ridge section; a first electrode formed on a top surface of the ridge section; an insulating layer covering the epitaxial layer in an adjacent region of the ridge section and a side surface of the ridge section, the insulating layer covering part or all of side surfaces of the first electrode continuously from the epitaxial layer; a pad electrode formed to cover a top surface of the first electrode and the insulating layer, the pad electrode being electrically connected to the first electrode; and a second electrode formed on a surface, of the semiconductor substrate, opposite to the semi-polar surface.

3 Claims, 10 Drawing Sheets

LASER DIODE DEVICE AND METHOD OF MANUFACTURING LASER DIODE DEVICE

CROSS REFERENCES TO RELATED APPLICATIONS

The present application claims priority to Japanese Priority Patent Application JP 2011-274256 filed in the Japan Patent Office on Dec. 15, 2011, the entire content of which is hereby incorporated by reference.

BACKGROUND

The present disclosure relates to a laser diode device and to a method of manufacturing a laser diode device. More specifically, the present disclosure relates to a hexagonal III-nitride laser diode device and to a method of manufacturing the same.

A laser diode is currently utilized in enormous numbers of technical fields. In particular, the laser diode is indispensable necessary optical device in the field of image display units such as a television and a projector. In such applications, a laser diode outputting light of red, green, and blue which are light's three primary colors is necessitated, and improvement of laser characteristics is desired.

In Japanese Unexamined Patent Application Publication No. 2009-176837, in order to effectively suppress higher-order mode light in a nitride-based laser diode device used in a short-wavelength region with a wavelength of about 400 nm, a configuration in which an insulating layer containing fine particles that absorb emitted light is formed on side surfaces of a ridge is disclosed. Red and blue laser diodes have been in practical use. Meanwhile, in recent years, a green (a wavelength from about 500 nm to about 560 nm both inclusive) laser diode has been actively developed (for example, see "The World's First True Green Laser Diodes on Novel Semi-Polar {2 0 $\bar{2}$ 1} GaN Substrates I," (hereinafter referred to as NPTL1) by Takashi Kyono et al., SEI Technical Review, Vol. 176, pp. 88-92 (January, 2010) and "The World's First True Green Laser Diodes on Novel Semi-Polar {2 0 $\bar{2}$ 1} GaN Substrates II," (hereinafter referred to as NPTL2) by Masahiro Adachi et al., SEI Technical Review, Vol. 176, pp. 93-96 (January, 2010)).

In NPTL1 and NPTL2, a III-nitride laser diode (green laser) in which an n-type cladding layer, a light emitting layer including an active layer configured of InGaN, and a p-type cladding layer are laminated in this order on a semi-polar surface {2, 0, −2, 1} of an n-type GaN substrate is proposed. It is to be noted that, in the present specification, a plane direction of a hexagonal crystal is described as {h, k, l, m} (h, k, l, and m represent plane indices).

In NPTL1 and NPTL2, crystal growth of an epitaxial layer is made on the semi-polar surface of the GaN substrate, and thereby, a green laser with superior crystal quality is achieved while influence of piezo electric field is suppressed. In NPTL2, a configuration in the case where a green laser apparatus has a refractive index waveguide (ridge type) structure is described. In the configuration, laser light is confined by forming an insulating layer with low refractive index on side surfaces of a ridge.

SUMMARY

As described above, in the existing laser diode devices, various configurations to prevent degradation of oscillation characteristics due to a ridge structure have been proposed. However, in the technical field of a laser diode device using a semi-polar substrate, there are many characteristics different from the characteristics of the existing nitride-based laser diode device using a polar substrate, and therefore, further development for improving the characteristics are desired.

It is desirable to provide a laser diode device with superior reliability that suppresses degradation of oscillation characteristics resulting from a ridge structure as a nitride-based laser diode device using a semi-polar substrate.

According to an embodiment of the present disclosure, there is provided a laser diode device including: a semiconductor substrate including a semi-polar surface, the semiconductor substrate being formed of a hexagonal III-nitride semiconductor; an epitaxial layer including a light emitting layer, the epitaxial layer being formed on the semi-polar surface of the semiconductor substrate, and the epitaxial layer including a ridge section; a first electrode formed on a top surface of the ridge section; an insulating layer covering the epitaxial layer in an adjacent region of the ridge section and a side surface of the ridge section, the insulating layer covering part or all of side surfaces of the first electrode continuously from the epitaxial layer; a pad electrode formed to cover a top surface of the first electrode and the insulating layer, the pad electrode being electrically connected to the first electrode; and a second electrode formed on a surface, of the semiconductor substrate, opposite to the semi-polar surface. Here, "adjacent region of the ridge section" refer to a surface, of the epitaxial layer, in a region other than the ridge section.

In the laser diode device according to the embodiment of the present disclosure, the insulating layer covers the epitaxial layer, and covers part or all of the side surfaces of the first electrode continuously from the epitaxial layer. Therefore, the pad electrode is not in direct contact with the epitaxial layer.

According to an embodiment of the present disclosure, there is provided a method of manufacturing a laser diode device, the method including: preparing a semiconductor substrate including a semi-polar surface, the semiconductor substrate being formed of a hexagonal III-nitride semiconductor; forming an epitaxial layer on the semi-polar surface of the semiconductor substrate, the epitaxial layer including a light emitting layer of the laser diode device; etching the epitaxial layer to a predetermined depth thereof through a mask, and forming a ridge section in a shape of a stripe; forming a first electrode in a region corresponding to the ridge section before the forming of the ridge section, or forming the first electrode on a top surface of the ridge section after the forming of the ridge section; forming an insulating material layer on a surface of the epitaxial layer including a top surface of the first electrode; etching the insulating material layer, and thereby forming an insulating layer, the insulating layer covering the epitaxial layer in an adjacent region of the ridge section and a side surface of the ridge section, and the insulating layer covering part or all of side surfaces of the first electrode continuously from the epitaxial layer; forming a pad electrode, the pad electrode covering a top surface of the first electrode and the insulating layer, the pad electrode being electrically connected to the first electrode; and forming a second electrode on a surface, of the semiconductor substrate, opposite to the semi-polar surface.

In the method of manufacturing a laser diode device according to the embodiment of the present disclosure, the insulating layer covers the epitaxial layer, and covers part or all of the side surfaces of the first electrode continuously from the epitaxial layer. Therefore, the pad electrode formed after forming the insulating layer is not in direct contact with the epitaxial layer.

According to the embodiments of the present invention, it is provided, a laser diode device suppressing degradation of oscillation characteristics resulting from a ridge structure and having superior reliability as a nitride-based laser diode device using a semi-polar substrate.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Figure 9:
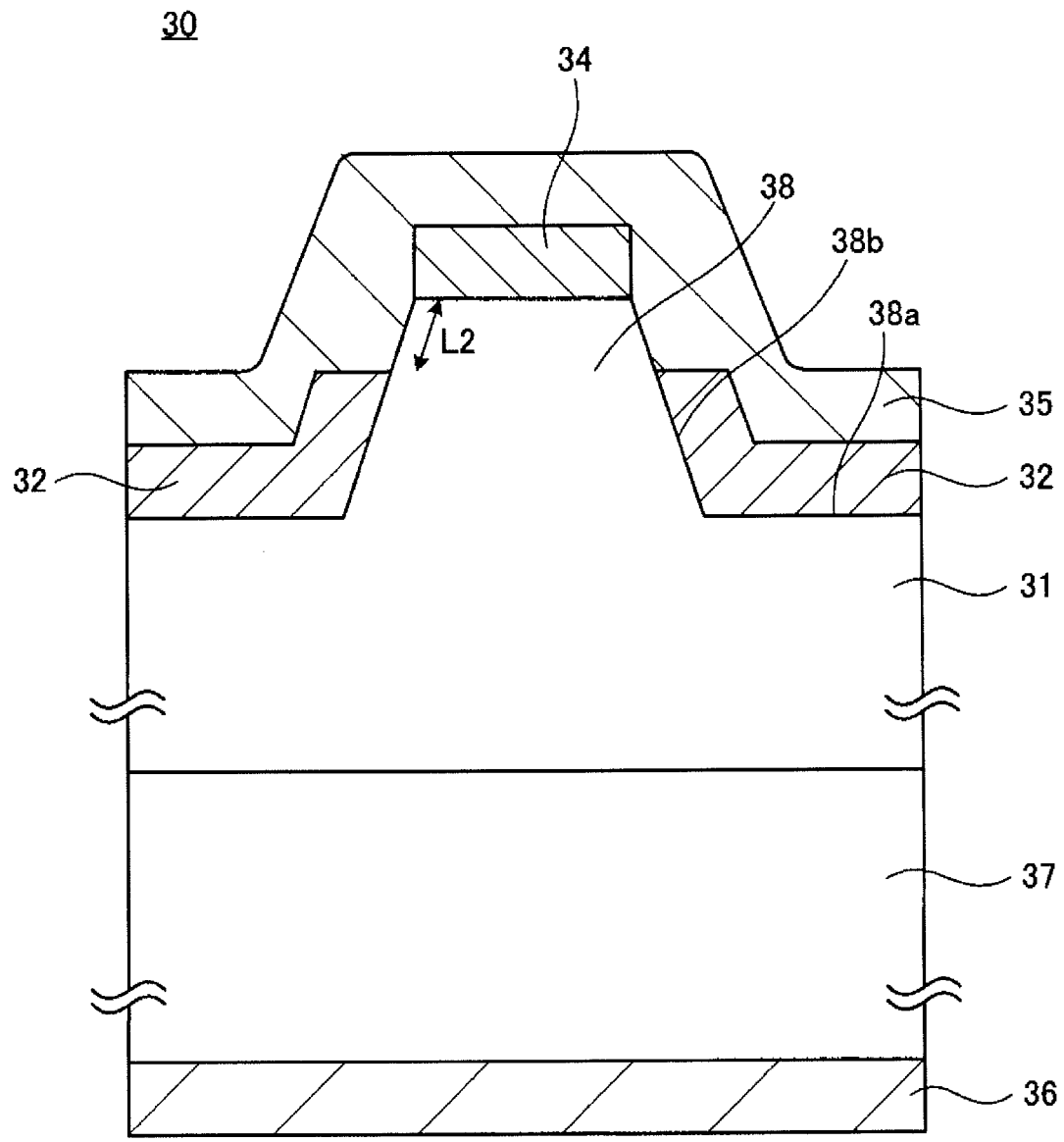
FIG. 9 is a cross-sectional configuration view of a nitride-based laser diode device having a ridge structure formed by an existing technology.

FIG. 9 illustrates a cross-sectional configuration view of a nitride-based laser diode device having a ridge structure formed by an existing technology. Typically, a nitride-based laser diode device 30 includes a semiconductor substrate 37 configured of n-type GaN, an epitaxial layer 31, an insulating layer 32, a first electrode (p-side electrode) 34, a second electrode (n-side electrode 36), and a pad electrode 35. The epitaxial layer 31 is formed on one surface of the semiconductor substrate 37. Though not illustrated, for example, the epitaxial layer 31 has a structure in which an n-type cladding layer, a light emitting layer, a p-type cladding layer, and a contact layer are laminated in this order of closeness to the semiconductor substrate 37. Further, in FIG. 9, a ridge section 38 is formed by removing part of the epitaxial layer 31.

The first electrode 34 is formed on a top surface of the ridge section 38 of the epitaxial layer 31. The insulating layer 32 is formed on a surface of the epitaxial layer 31 to cover adjacent regions 38a of the ridge section and side surfaces 38b of the ridge section. The pad electrode 35 is formed on the whole surface including the insulating layer 32 and the first electrode 34. The second electrode 36 is formed on the other surface (rear surface) of the semiconductor substrate 37.

In the existing technology, the laser diode device 30 as illustrated in FIG. 9 is formed, for example, as follows. First, after the epitaxial layer 31 is formed on the surface of the semiconductor substrate 37, the stripe-like first electrode 34 is formed in a predetermined position where the ridge section 38 is to be formed. Thereafter, a portion from a surface of the unillustrated contact layer of the epitaxial layer 31 to a predetermined position of the unillustrated p-type cladding layer of the epitaxial layer 31 is removed by etching with the use of the first electrode 34 as a mask. Next, after the insulating layer 32 is formed on the whole surface, the insulating layer on the first electrode 34 is removed with a desired resist mask by etching until the first electrode 34 is exposed. Thereafter the resist mask is removed, and the pad electrode 35 is formed on the insulating layer 32 and the exposed first electrode 34.

In the step of etching the insulating layer 32 to expose the first electrode 34, the insulating layer 32 on the first electrode 34 is typically over-etched in order to securely achieve electric contact between the first electrode 34 and the pad electrode 35 formed thereon. That is, the insulating layer 32 is typically etched until part of side surfaces of the epitaxial layer 31 shaped into the ridge structure is exposed in order to prevent the insulating layer 32 from remaining on the first electrode 34.

As a result, in the existing technology, as illustrated in FIG. 9, in a region with exposure length L2 where the epitaxial layer 31 is exposed from the insulating layer 32, the pad electrode 35 formed on the first electrode 34 and the epitaxial layer 31 exposed from the insulating layer 32 are in contact with one another directly.

However, in the existing nitride-based laser diode device emitting blue light, some minor contact between the epitaxial layer and the pad electrode does not cause a disadvantage such as degraded laser characteristics. Therefore, the configuration illustrated in FIG. 9 has not been considered to have an issue. On the other hand, the proposers of the technology of the present disclosure have developed a laser diode device using a semi-polar surface of a GaN substrate as a crystal growth surface, and have found that, in the configuration in which the epitaxial layer 31 is exposed from the insulating layer 32 as illustrated in FIG. 9, voltage degradation occurs at the same time as power distribution.

Figure 10:
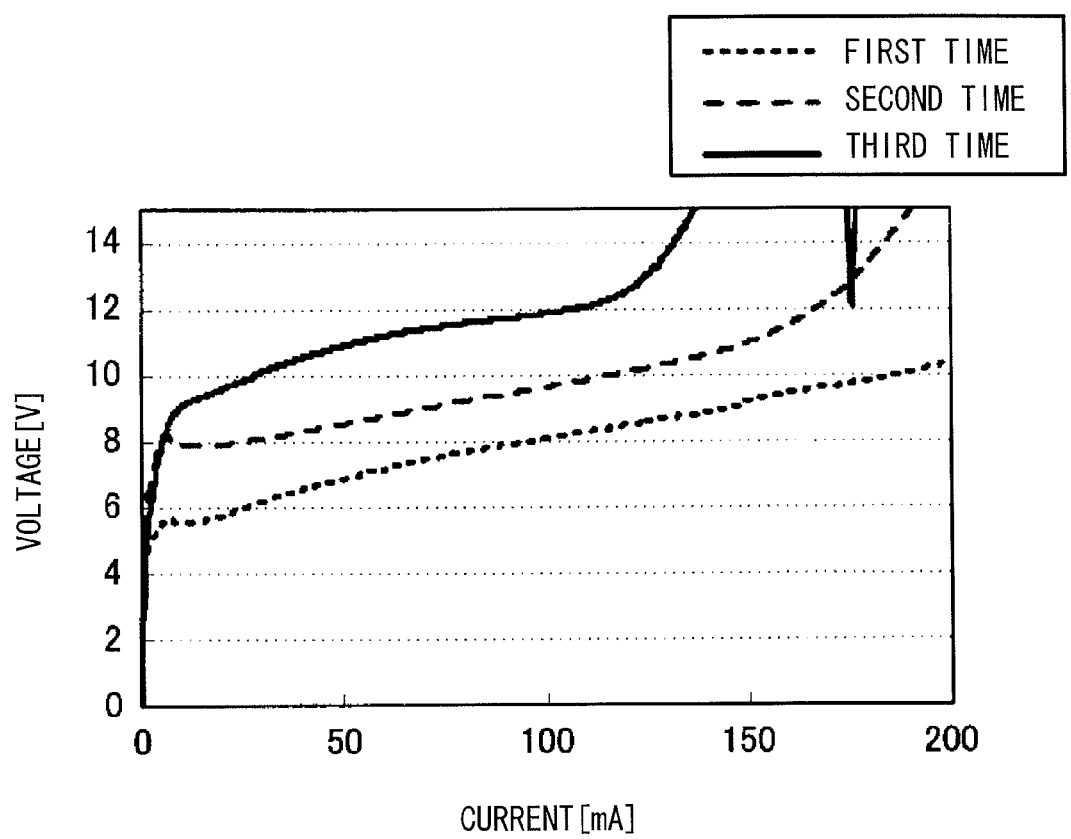
FIG. 10 is a diagram illustrating voltage-current characteristics of a laser diode device in which a semi-polar surface of a GaN substrate is used as a crystal growth surface, and about 200 nm of an epitaxial layer is exposed from an insulating layer (exposure length L2 of FIG. 9: about 200 nm).

FIG. 10 illustrates voltage-current characteristics of a laser diode device in which a semi-polar surface of a GaN substrate is used as a crystal growth surface, and about 200 nm of an epitaxial layer is exposed from an insulating layer (exposure length L2 in FIG. 9: about 200 nm). The horizontal axis of FIG. 10 indicates a current, and the vertical axis of FIG. 10 indicates a voltage. Further, FIG. 10 illustrates respective voltage-current characteristics of the same laser diode device in the case where measurement was performed thereon three times sequentially.

As illustrated in FIG. 10, the operating voltage with respect to the operating current is increased from the first measurement to the third measurement. That is, the later the measurement is, the larger the operating voltage is. In the case where such voltage increase occurs, the device is degraded, and is not allowed to be operated stably for a long time.

As described above, in the laser diode device formed by laminating the crystal layer on the semi-polar surface of the semiconductor substrate, in the case where a portion in which no insulating layer is formed on the side surfaces of the ridge section exists, device degradation due to voltage increase is significant. Such a disadvantage of degraded characteristics is specific to a laser diode device using a semi-polar substrate, and has not been seen in the existing laser diode device using a polar substrate. For the semi-polar substrate and the polar substrate, descriptions will be given later.

Based on the foregoing finding, the proposers of the technology of the present disclosure have found a laser diode device in which voltage increase is suppressed and device degradation is decreased, as a laser diode device obtained by laminating a crystal layer on a semi-polar surface of a semiconductor substrate. A description will be hereinafter given of a laser diode device according to an embodiment of the present disclosure.

A description will be hereinafter given of the laser diode device according to the embodiment of the present disclosure and a method of manufacturing the same with reference to the drawings. The embodiment of the present disclosure will be described in the following order. It is to be noted that the present disclosure is not limited to the following examples.
1. Configuration of Laser Diode Device
2. Method of Manufacturing Laser Diode Device
3. Experimental Result

[1. Configuration of Laser Diode Device]

A laser diode device according to an embodiment of the present disclosure is a laser device oscillating green light, and a refractive index waveguide type (ridge type) laser diode device having a ridge structure. A description will be hereinafter given of the laser diode device according to this embodiment.

[Whole Configuration of Laser Diode Device]

Figure 1:
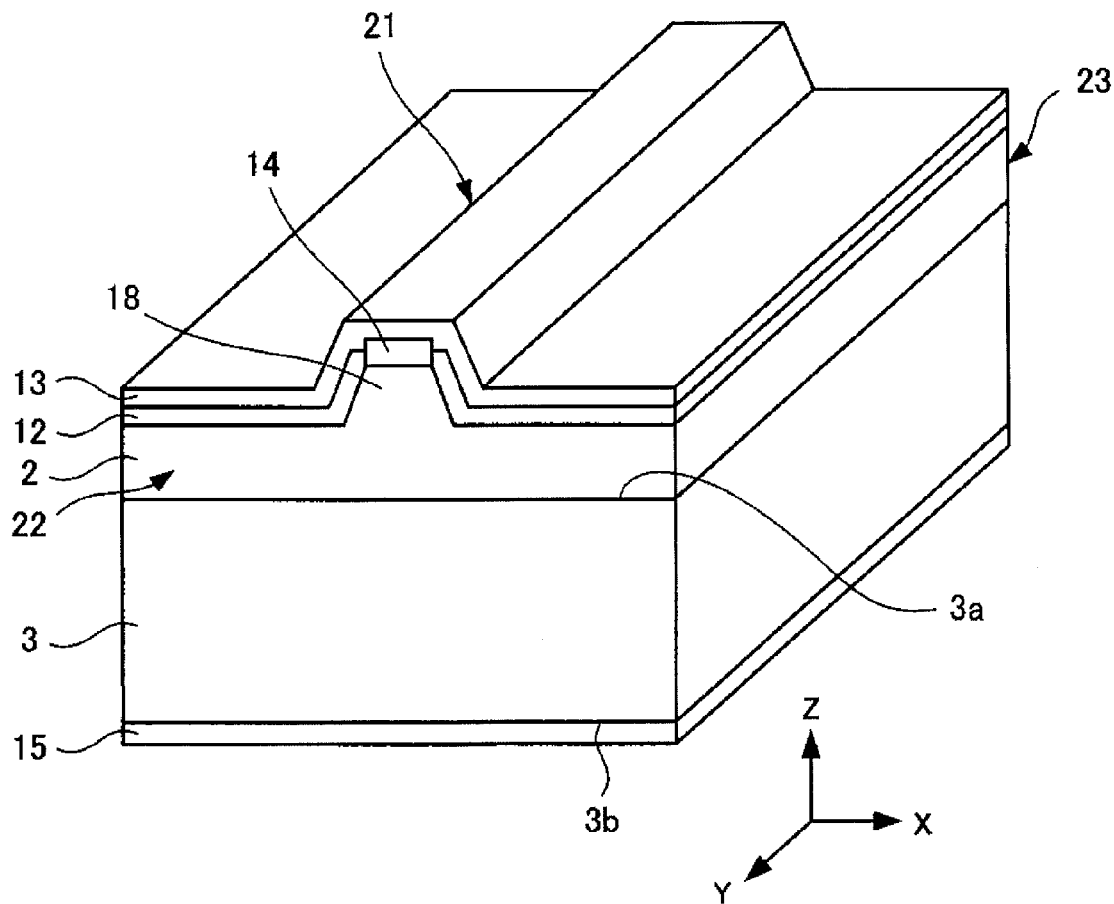
FIG. 1 is a schematic appearance view of a laser diode device according to an embodiment of the present disclosure.

FIG. 1 illustrates a schematic appearance view of the laser diode device according to the embodiment of the present disclosure. In this embodiment, a ridge type (refractive index waveguide type) laser diode device 1 is exemplified.

The laser diode device 1 includes a semiconductor substrate 3, an epitaxial layer 2, an insulating layer 12, a first electrode 14, a second electrode 15, and a pad electrode 13. In the laser diode device 1 according to this embodiment, the epitaxial layer 2, the insulating layer 12, the first electrode 14, and the pad electrode 13 are laminated in this order on one surface 3a of the semiconductor substrate 3 (top surface of the semiconductor substrate 3 in an example shown in FIG. 1, and hereinafter referred to as "semi-polar surface 3a"). Further, the second electrode 15 is formed on the other surface 3b of the semiconductor substrate 3 (bottom surface of the semiconductor substrate 3 in the example shown in FIG. 1, and hereinafter referred to as "rear surface 3b"). It is to be noted that, as described later, the semiconductor substrate 3 is a semi-polar substrate in which the semi-polar surface 3a is a semi-polar surface such as a $\{2, 0, -2, 1\}$ surface. A lamination direction of the epitaxial layer 2, the insulating layer 12, the first electrode 14, and the pad electrode 13 (Z direction in FIG. 1) is to direction (Z direction in FIG. 1) of the normal to the semi-polar surface 3a.

The laser diode device 1 has a shape of an approximately rectangular solid. Further, on the surface on the first electrode 14 side of the laser diode device 1, a stripe section 21 having a ridge structure extending in a predetermined direction (the Y direction in FIG. 1) is formed. The extension direction of the stripe section 21 is a waveguide direction of laser light. A region of the epitaxial layer 2 corresponding to the stripe section 21 is a light waveguide.

Further, the laser diode device 1 has two side surfaces 22 and 23 (end surfaces) perpendicular to the extension direction of the stripe section 21 (Y direction in FIG. 1). It is to be noted that the stripe section 21 is formed to extend from one side surface 22 to the other side surface 23. The two side surfaces 22 and 23 (torn surfaces) function as reflecting surfaces of a laser resonator. Therefore, the side surfaces 22 and 23 will be hereinafter referred to as resonance end surfaces.

In this embodiment, the extension direction of the stripe section 21 is a direction perpendicular to the a-axis direction. However, the extension direction of the stripe section 21 is not limited to this example, and may be set as appropriate according to, for example, applications and conditions such as necessary oscillation wavelength. Further, a width of the stripe section 21 is about several μm, and a length between the two resonance end surfaces 22 and 23 is about several hundred μm.

In the laser diode device 1 according to this embodiment, a dielectric multilayer film configured of, for example, $SiO_2$ and $Ti_2$ may be formed on one or both of the two resonance end surfaces 22 and 23 (end surface coating). By performing the end surface coating, reflectance is allowed to be adjusted.

[Configurations of Respective Sections]

Next, configurations of the respective sections of the laser diode device 1 according to this embodiment will be described more specifically.

[(1) Semiconductor Substrate]

The semiconductor substrate 3 is configured of a hexagonal III-nitride semiconductor such as GaN, MN, AlGaN, InGaN, and InAlGaN. Further, as the semiconductor substrate 3, a substrate in which carrier conductivity type is n-type may be used. In this embodiment, one surface of the semiconductor substrate 3 on which the epitaxial layer 2, the insulating layer 12, and the first electrode 14 are formed is not configured of the surface-plane (polar surface) but is configured of the semi-polar surface 3a.

Figure 2A:
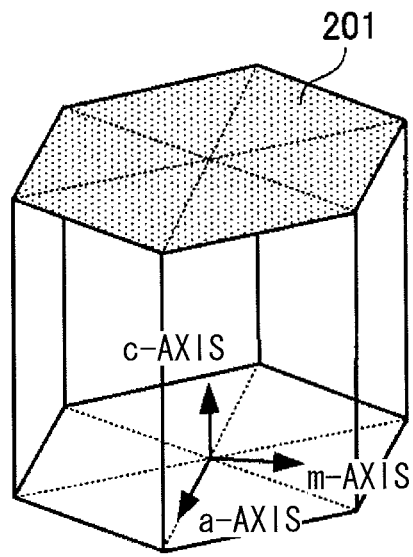
FIG. 2A is a diagram clearly illustrating a c-plane in a GaN crystal structure.
Figure 2B:
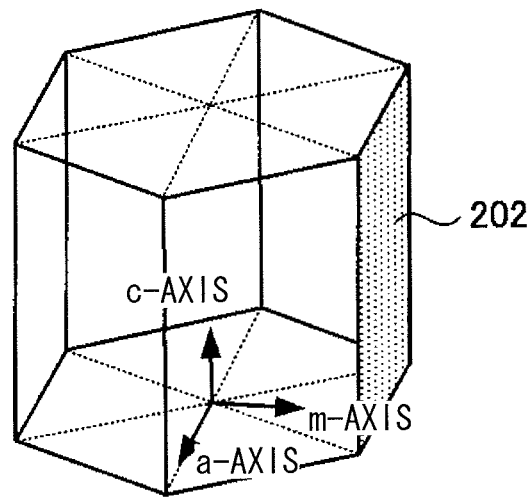
FIG. 2B is a diagram clearly illustrating an m-plane in the GaN crystal structure.
Figure 3:
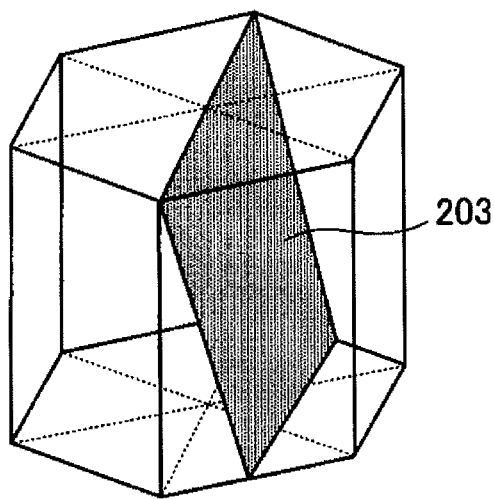
FIG. 3 is a diagram clearly illustrating a semi-polar surface in the GaN crystal structure.

FIGS. 2A, 2B, and 3 illustrate a GaN crystal structure. As illustrated in FIGS. 2A and 2B, GaN has a crystal structure called hexagonal crystal. Piezo electric field generated in the light emitting layer is generated along a c-axis. Therefore, a c-plane 201 ($\{0, 0, 0, 1\}$ surface) perpendicular to the c-axis has polarity, and is called a polar surface. On the other hand, an m-plane 202 ($\{1, 0, -1, 0\}$ surface) perpendicular to an m-axis is in parallel with the c-axis, and therefore, is a non-polar surface. On the other hand, a surface in which an axis direction obtained by tilting the c-axis in the m-axis direction at a predetermined angle is a direction of a normal thereto, for example, a surface in which an axis direction obtained by tilting the c-axis in the m-axis direction at 75° is the direction of the normal thereto ($\{2, 0, -2, 1\}$ surface 203) in the example illustrated in FIG. 3 is an intermediate surface between the c-plane and the m-plane, and is called a semi-polar surface.

As this embodiment, in the case where the epitaxial layer 2, the insulating layer 12, and the first electrode 14 are formed on the semi-polar surface 3a of the semiconductor substrate 3, for example, green light with a wavelength of around 500 nm is allowed to be oscillated.

As the semi-polar surface 3a, a crystal surface in which the direction of the normal to the semi-polar surface 3a is a direction obtained by tilting the c-axis in the m-axis direction at an angle from 45° to 80° both inclusive or at an angle from 100° to 135° both inclusive may be used. It is to be noted that, in the case where an angle between the direction of the normal to the semi-polar surface 3a and the c-axis is smaller than 45° or larger than 135°, a possibility that an end surface formed by cleavage process (pressing process) becomes the m-plane (nonpolar surface) is high. Further, in the case where the angle between the direction of the normal to the semi-polar surface 3a and the c-axis is larger than 80° and smaller than 135°, there is a possibility that an end surface having desired flatness and desired orthogonality is not obtained.

Further, in the foregoing angle ranges, the angle between the direction of the normal to the semi-polar surface 3a and the c-axis is preferably from 63° to 80° both inclusive or is preferably from 100° to 117° both inclusive in order to obtain light emission with long wavelength. In these angle ranges, piezo polarization in an after-mentioned light emitting layer 7 in the epitaxial layer 2 is decreased, intake of In at the time of growing (forming) an active layer becomes favorable, and the variable range of In composition in the light emitting layer 7 (active layer) is allowed to be enlarged. Therefore, by setting the angle between the direction of the normal to the semi-polar surface 3a and the c-axis to a value within the foregoing ranges, light emission with a long wavelength is easily obtained.

As the semi-polar surface 3a having the direction of the normal thereto in the foregoing angel ranges, for example, a crystal surface such as a {2, 0, −2, 1} surface, a {1, 0, −1, 1} surface, a {2, 0, −2, −1} surface, and a {1, 0, −1, −1} surface may be used. It is to be noted that a crystal surface slightly tilted from the foregoing crystal surfaces at ±4° may be also used as the semi-polar surface 3a. In this embodiment, n-type GaN is used as the semiconductor substrate 3, and its {2, 0, −2, 1} surface is used as one main surface. Since GaN is a gallium-nitride-based semiconductor as a two-dimensional compound, favorable crystal quality and a stable substrate surface (main surface) are provided.

[(2) Epitaxial Layer, Insulating Layer, First Electrode, Second Electrode, and Pad Electrode]

Figure 4:
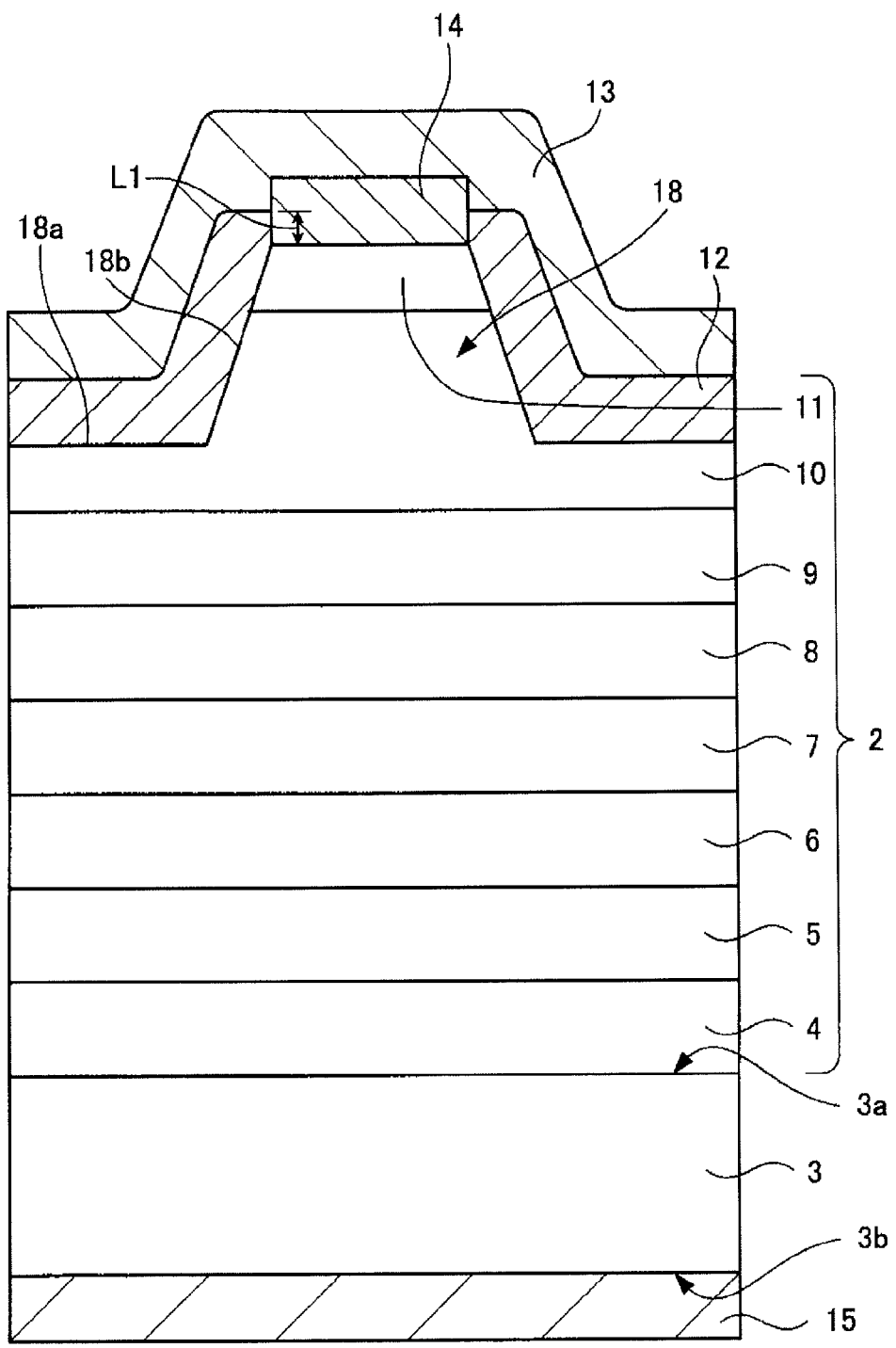
FIG. 4 is a schematic cross-sectional view in a thickness direction (Z direction in the figure) of the laser diode device according to the embodiment of the present disclosure.

Next, descriptions will be given of configurations of the epitaxial layer 2, the insulating layer 12, the first electrode 14, the second electrode 15, and the pad electrode 13 of the laser diode device 1 of this embodiment with reference to FIG. 4. FIG. 4 is a schematic cross-sectional view in the thickness direction (Z direction in the figure) of the laser diode device 1. It is to be noted that FIG. 4 illustrates a cross section perpendicular to the extension direction (Y direction in the figure) of the stripe section 21.

In this embodiment, the epitaxial layer 2 includes a buffer layer 4, a first cladding layer 5, a first light guide layer 6, the light emitting layer 7, a second light guide layer 8, a carrier blocking layer 9, a second cladding layer 10, and a contact layer 11. The buffer layer 4, the first cladding layer 5, the first light guide layer 6, the light emitting layer 7, the second light guide layer 8, the carrier blocking layer 9, the second cladding layer 10, and the contact layer 11 are laminated in this order on the semi-polar surface 3a of the semiconductor substrate 3.

The buffer layer 4 is formed on the semi-polar surface 3a as one main surface of the semiconductor substrate 3, and is configured of a gallium-nitride-based semiconductor layer added with n-type dopant. More specifically, for example, the buffer layer 4 may be configured of an n-type GaN layer, and Si is applicable as the n-type dopant. Further, the film thickness of the buffer layer 4 is preferably from 100 nm to 2000 nm both inclusive, for example.

The first cladding layer 5 is formed on the buffer layer 4, and is configured of one or a plurality of gallium-nitride-based semiconductor layers added with n-type dopant. More specifically, for example, the first cladding layer 5 may be configured of an n-type GaN layer, an n-type AlGaN layer, an n-type InAlGaN layer, or the like, and Si is applicable as the n-type dopant. Further, the film thickness of the first cladding layer 5 is preferably from 500 nm to 3000 nm both inclusive, for example.

The first light guide layer 6 is formed on the first cladding layer 5, and is configured of one or a plurality of gallium-nitride-based semiconductor layers. More specifically, for example, the first light guide layer 6 may be configured of an n-type GaN layer, an n-type InGaN layer, an n-type InAlGaN layer, or the like. In addition thereto, the first light guide layer 6 may be configured of a non-doped gallium-nitride-based semiconductor layer, or may have a laminated structure configured of an n-type layer and a non-doped layer. Further, the film thickness of the first light guide layer 6 is preferably from 10 nm to 500 nm both inclusive, for example.

The light emitting layer 7 is formed on the first light guide layer 6, and has a configuration in which, for example, a well layer (not illustrated) and a barrier layer (not illustrated) that are configured of non-doped gallium-nitride-based semiconductor layers not added with impurity are alternately arranged. More specifically, for example, the well layer and the barrier layer may be configured of an AlGaN layer, a GaN layer, an InGaN layer, an InAlGaN layer, or the like. Alternatively, the light emitting layer 7 (in particular, the barrier layer) may be configured of a gallium-nitride-based semiconductor layer doped with n-type dopant. In this case, a bandgap of the barrier layer is set to a larger value than that of a bandgap of the well layer. Further, the film thicknesses of the respective layers are preferably from 1 nm to 100 nm both inclusive, for example.

The light emitting layer 7 may have a single quantum well structure including a single well layer, or may have a multi-quantum well structure in which a plurality of well layers and a plurality of barrier layers are alternately arranged. In this embodiment, by laminating each layer on the semi-polar surface 3a of the semiconductor substrate 3, the light emitting layer 7 is allowed to be formed to oscillate light with wavelength from 430 nm to 570 nm both inclusive. Further, the structure of the laser diode device 1 according to this embodiment is particularly suitable for oscillating light with wavelength from 480 nm to 550 nm both inclusive.

The second light guide layer 8 is formed on the light emitting layer 7, and is configured of one or a plurality of gallium-nitride-based semiconductor layers. More specifically, for example, the second light guide layer 8 may be configured of a GaN layer, an InGaN layer, or the like, and a p-type gallium-nitride-based semiconductor layer doped with Mg is applicable thereto. Further, the film thickness of the second light guide layer 8 is preferably from 10 nm to 500 nm both inclusive, for example.

The carrier blocking layer 9 (electron blocking layer) is formed on the second light guide layer 8, and is configured of a gallium-nitride-based semiconductor layer added with p-type dopant. More specifically, for example, the carrier blocking layer 9 may be configured of a p-type AlGaN layer or the like, and Mg is applicable as the p-type dopant. Further, the film thickness of the carrier blocking layer 9 is preferably from 5 nm to 100 nm both inclusive, for example. It is to be noted that the carrier blocking layer 9 may be formed between the light emitting layer 7 and the second light guide layer 8, or may be formed in the middle of the second light guide layer 8. Further, a configuration in which the carrier blocking layer 9 is not provided in the epitaxial layer 2 may be adopted. Even if the carrier blocking layer 9 is not provided, a function as a laser diode device is retained as well.

The second cladding layer 10 is formed on the carrier blocking layer 9, and is configured of one or a plurality of gallium-nitride-based semiconductor layers. More specifically, for example, the second cladding layer 10 may be configured of a p-type GaN layer, a p-type AlGaN layer, a p-type InAlGaN layer, or the like, and Mg is applicable as the p-type dopant. Further, the film thickness of the second cladding layer 10 is preferably from 100 nm to 1000 nm both inclusive, for example.

The contact layer 11 is formed on the second cladding layer 10, and is configured of a gallium-nitride-based semiconductor layer added with p-type dopant. More specifically, for example, the contact layer 11 may be configured of a p-type GaN layer, and Mg is applicable as the p-type dopant. Further, the film thickness of the contact layer 11 is preferably from 5 nm to 100 nm both inclusive, for example.

In this embodiment, a convex ridge section 18 is formed by etching, in a tapered shape, and removing a portion from the surface of the contact layer 11 to the middle of the second cladding layer 10 in opposing side surfaces in one direction of the epitaxial layer 2 laminated on the semiconductor substrate 3. The ridge section 18 configures the stripe section 21 illustrated in FIG. 1, and is formed in a shape of a stripe extending in the Y direction of the epitaxial layer 2. In this embodiment, the example in which the ridge section 18 is formed by etching down to the middle of the second cladding layer 10 is described. Alternatively, the ridge section may be formed by etching down to a layer below the second cladding layer 10.

As illustrated in FIG. 1, surfaces perpendicular to the extension direction of the ridge section 18 are the resonance end surfaces 22 and 23 configuring the resonator. The resonance end surfaces 22 and 23 are configured of torn surfaces. Since the laser diode device 1 according to this embodiment has the configuration in which the epitaxial layer 2 is laminated on the semi-polar surface 3a of the semiconductor substrate 3, the resonance end surfaces 22 and 23 are different from the before-mentioned cleaved surfaces such as the surface-plane, the surface-plane, and the a-plane. However, in this embodiment, the resonance end surfaces 22 and 23 also have flatness and vertical characteristics as a mirror.

The first electrode 14 is configured of one or a plurality of conductive film layers, and is formed to be electrically connected to the contact layer 11 at the top of the contact layer 11. As described later, in this embodiment, the first electrode 14 is formed before forming the ridge section 18. The first electrode 14 is formed in the shape of a stripe extending in the Y direction on the top of the contact layer 11. As a conductive material of the first electrode 14, a material capable of ohmic contact with the contact layer 11 may be used. More specifically, for example, a laminated film configured of a Pd film and a Pt film that are formed in this order of closeness to the contact layer 11 is applicable.

The insulating layer 12 is formed to cover the top of the second cladding layer 10 of adjacent regions 18a of the ridge section, to cover side surfaces 18b of the ridge section configured of the second cladding layer 10 and the contact layer 11, and to reach the side surfaces of the first electrode 14. Here, the adjacent regions 18a of the ridge section refer to a surface in a region, of the epitaxial layer 2, other than the ridge section 18. As the insulating layer 12, for example, an insulating material containing one or more of $SiO_2$, SiN, $Al_2O_3$, and $ZrO_2$ is applicable. Film thickness thereof is preferably from 100 nm to 500 nm both inclusive, for example.

Further, in FIG. 4, the insulating layer 12 covers part of the side surfaces of the first electrode 14. Alternatively, the insulating layer 12 may be formed to cover all of the side surfaces of the first electrode 14. That is, it is enough that the insulating layer 12 covers part or all of the side surfaces of the first electrode 14 continuously from the contact layer 11.

The pad electrode 13 is formed on the insulating layer 12 and the first electrode 14 exposed from the insulating layer 12, and is formed to be electrically connected to the first electrode 14. As the pad electrode 13, for example, a laminated film configured of a Ti film, a Pt film, and an Au film that are formed on the first electrode 14 in this order of closeness to the first electrode 14 is applicable. The film thickness of the Ti film is preferably from 5 nm to 100 nm both inclusive, the film thickness of the Pt film is preferably from 10 nm to 300 nm both inclusive, and the film thickness of the Au film is preferably from 100 nm to 1000 nm both inclusive. Since the lowermost layer of the pad electrode 13 is configured of the Ti film, a metal film in contact with the insulating layer 12 is the Ti film, and therefore, adhesive characteristics of the pad electrode 13 with respect to the insulating layer 12 are improved.

The second electrode 15 is configured of a conductive film of one or a plurality of layers, and is formed on the other surface (rear surface 3b) of the semiconductor substrate 3. As a conductive material of the second electrode 15, more specifically, for example, a laminated film configured of a Ti film and an Al film that are formed in this order of closeness to the semiconductor substrate 3 is applicable. The film thickness of the Ti film is preferably from 5 nm to 50 nm both inclusive, and the film thickness of the Al film is preferably from 10 nm to 300 nm both inclusive. In this embodiment, by flowing a desired current between the first electrode 14 and the second electrode 15, green light with wavelength from 480 nm to 550 nm both inclusive is oscillated.

[2. Method of Manufacturing Laser Diode Device]

Figure 5:
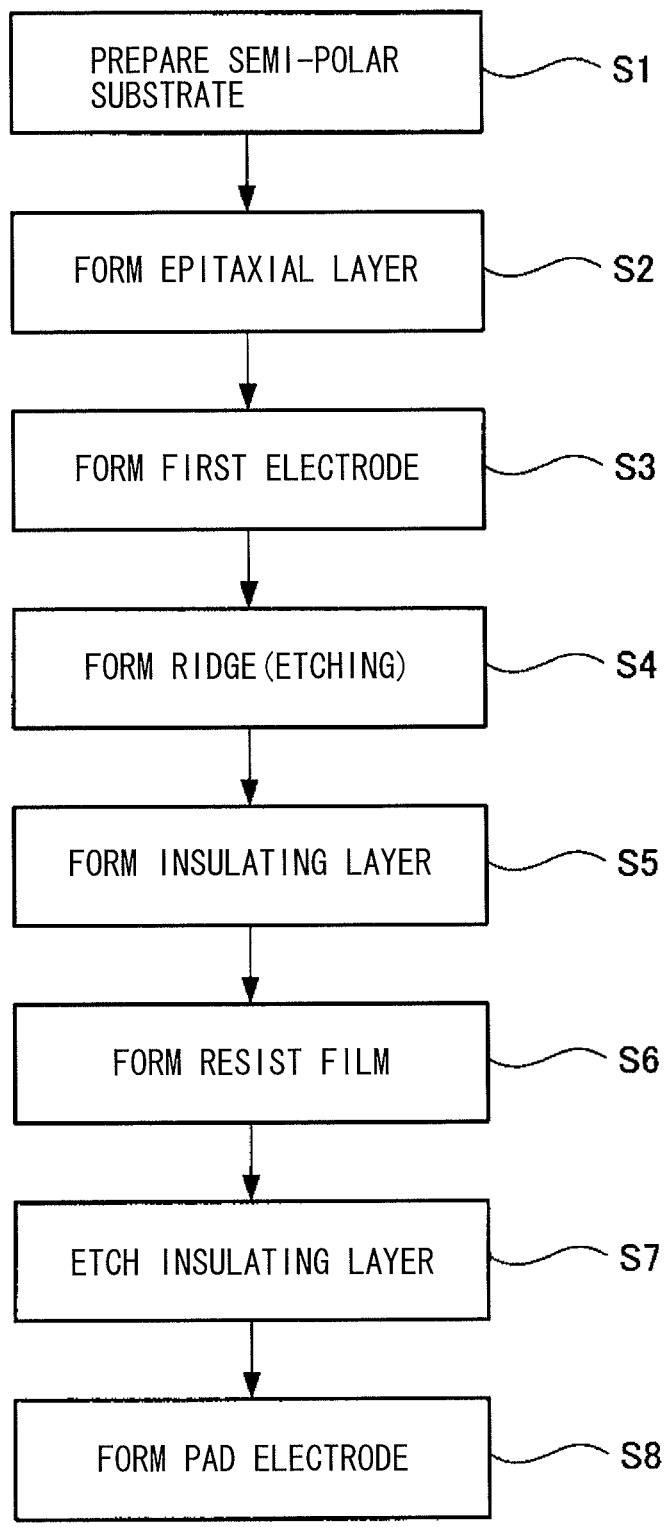
FIG. 5 illustrates a flow chart illustrating steps of manufacturing the laser diode device according to the embodiment of the present disclosure.

Next, a description will be given of a method of manufacturing the laser diode device 1 according to this embodiment. FIG. 5 is a flowchart illustrating processes of manufacturing the laser diode device 1 according to this embodiment. FIG. 6A to FIG. 6I are diagrams of the manufacturing steps.

First, the semiconductor substrate 3 having a semi-polar surface configured of a hexagonal III-nitride semiconductor, that is, what we call a semi-polar substrate is prepared (step S1). Further, thermal cleaning is performed on the prepared semiconductor substrate 3.

Next, the respective semiconductor layers configuring the epitaxial layer 2 are sequentially and epitaxially grown on the semi-polar surface of the semiconductor substrate 3 by using, for example, an MOVPE (organic metal vapor-phase epitaxy) method and/or the like, and thereby, the epitaxial layer 2 is formed (step S2). Specifically, the respective semiconductor layers configuring the buffer layer 4, the first cladding layer 5, the first light guide layer 6, the light emitting layer 7, the second light guide layer 8, the carrier blocking layer 9, the second cladding layer 10, and the contact layer 11 are epitaxially grown in this order on the semiconductor substrate 3.

Figure 6A:
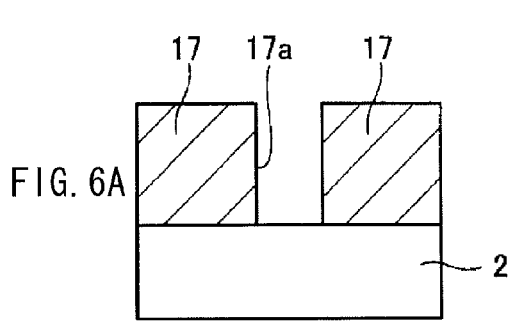
FIGS. 6A to 6I are diagrams of the steps of manufacturing the laser diode device according to the embodiment of the present disclosure.

Next, the first electrode 14 is formed on the epitaxial layer 2 (contact layer 11) (step S3). In this case, first, as illustrated in FIG. 6A, a resist film 17 having an opening 17a to expose the epitaxial layer 2 (contact layer 11) is formed. The resist film 17 is formed by coating the whole surface including an insulating layer 16 and the contact layer 11 with a resist material, and subsequently exposing and developing the resultant by using a desired photomask. As the material of the resist film 17, for example, a positive-type resist may be used.

Figure 6B:
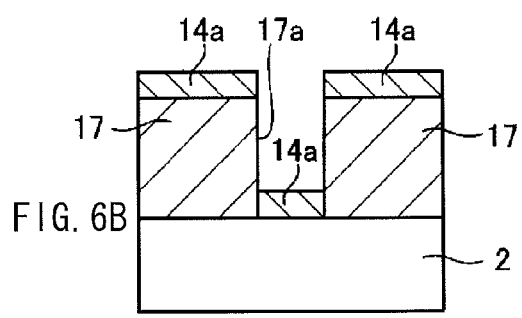
Figure 6C:
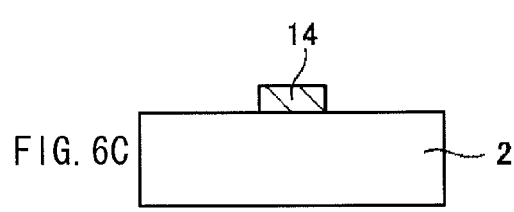

Next, as illustrated in FIG. 6B, a conductive film 14a for forming the first electrode 14 is formed on the whole surface of the exposed epitaxial layer 2 (contact layer 11). The conductive film 14a may be formed by using a method such as a vacuum evaporation method and a sputtering method. Thereafter, the resist film 17 is removed (lifted off) together with the conductive film 14a formed thereon, and thereby, the first electrode 14 illustrated in FIG. 6C is formed.

Figure 6D:
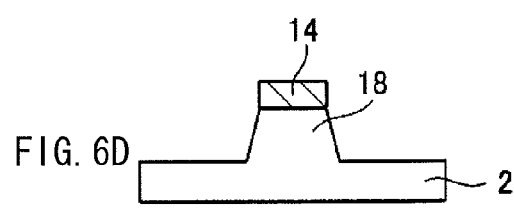

Next, the ridge section 18 is formed (step S4). The ridge section 18 is formed by forming the first electrode 14, and subsequently etching the epitaxial layer 2 from the surface of the epitaxial layer 2 (contact layer 11) to a predetermined depth in the second cladding layer 10 with the use of the first electrode 14 extending in the Y direction as a mask, as illustrated in FIG. 6D.

Figure 6E:
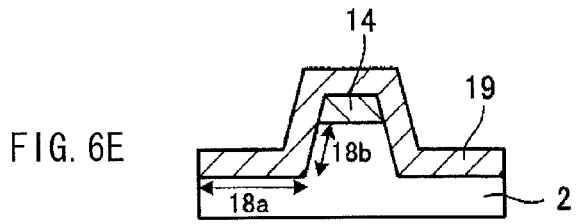

Next, an insulating material layer 19 to become the insulating layer 12 is formed (step S5). In this case, as illustrated in FIG. 6E, the insulating material layer 19 is formed on the whole surface including the adjacent regions 18a of the ridge section, the side surfaces 18b of the ridge section, and the surface of the first electrode 14. The insulating material layer 19 may be formed by a method such as an evaporation method and a sputtering method.

Figure 6F:
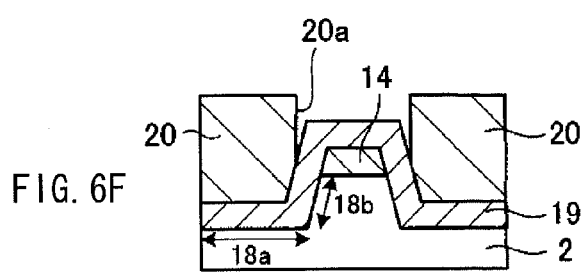

Next, a resist film 20 for etching the insulating material layer 19 is formed (step S6). In this case, first, the whole surface of the insulating material layer 19 is coated with a resist material layer. Thereafter, the resultant is exposed and developed by using a photomask in which a desired pattern is formed. Thereby, as illustrated in FIG. 6F, the resist film 20 having an opening 20a that opens a portion located above the first electrode 14 is formed.

Figure 6G:
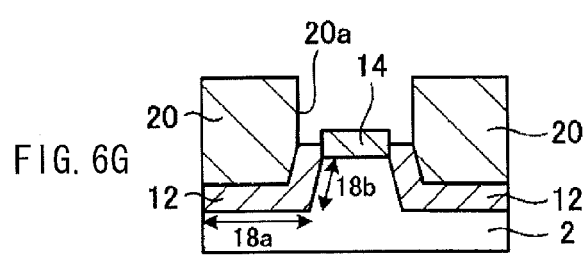

Next, the insulating layer on the first electrode 14 is etched by using the resist film 20 as a mask (step S7). In this etching step, as an etching method, dry etching or wet etching may be used. In this case, as illustrated in FIG. 6G, the insulating material layer 19 is etched and removed by using the resist film 20 as a mask, and the etching is stopped at the time when the first electrode 14 is exposed. Thereby, the insulating layer 12 that covers the adjacent regions 18a of the ridge section, the side surfaces 18b of the ridge section, and part or all of the side surfaces of the first electrode 14 is formed. It is to be noted that, in this case, etching is performed by using an etching profile with which the epitaxial layer 2 of the ridge section 18 is not exposed.

Figure 6H:
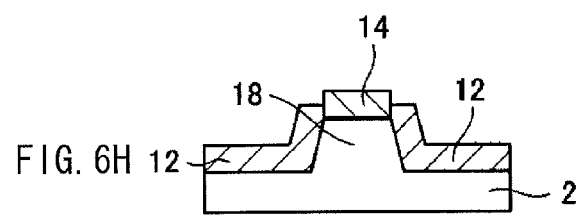

As described above, in this embodiment, the insulating layer 12 is formed to cover part or all of the side surfaces of the first electrode 14 continued from the side surfaces 18b of the ridge section. Therefore, in this etching step, etching is performed under conditions in which the side surfaces of the first electrode 14 are not entirely exposed. Thereafter, as illustrated in FIG. 6H, the resist film 20 is removed.

Figure 6I:
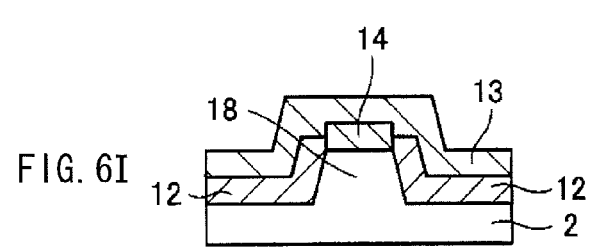

Next, the pad electrode 13 is formed (step S8). In this case, for example, a desired conductive film is formed by using a method such as a vacuum evaporation method and a sputtering method. Thereby, as illustrated in FIG. 6I, the pad electrode 13 is formed on the whole surface of the insulating layer 12 and the first electrode 14.

Thereafter, though not illustrated, the second electrode 15 is formed on the rear surface 3b of the semiconductor substrate 3 by, for example, a liftoff method to form a laser structure. It is to be noted that the laser diode device 1 is formed by cutting the laser diode device 1 from a substrate member in which a plurality of laser diode devices 1 are two-dimensionally formed. That is, a laser bar is formed by cutting the semiconductor substrate 3 to form the resonance end surfaces 22 and 23, coating is performed on the resonance end surfaces 22 and 23, and subsequently the laser bar is cut to obtain a chipped state. Accordingly, the laser diode device 1 according to this embodiment is fabricated.

[3. Experimental Result]

Next, a description will be given of characteristics difference between the laser diode device 1 fabricated in this embodiment and a laser diode device of a comparative example. The laser diode device of the comparative example is an example in which the epitaxial layer 2 is exposed from the insulating layer 12 in the laser diode device 1 according to this embodiment. That is, the laser diode device of the comparative example has the structure illustrated in FIG. 9. Therefore, in the laser diode device 1 according to this embodiment and the laser diode device of the comparative example, all materials configuring the respective layers are identical, and only the configurations of the respective insulating layers are different.

Figure 7:
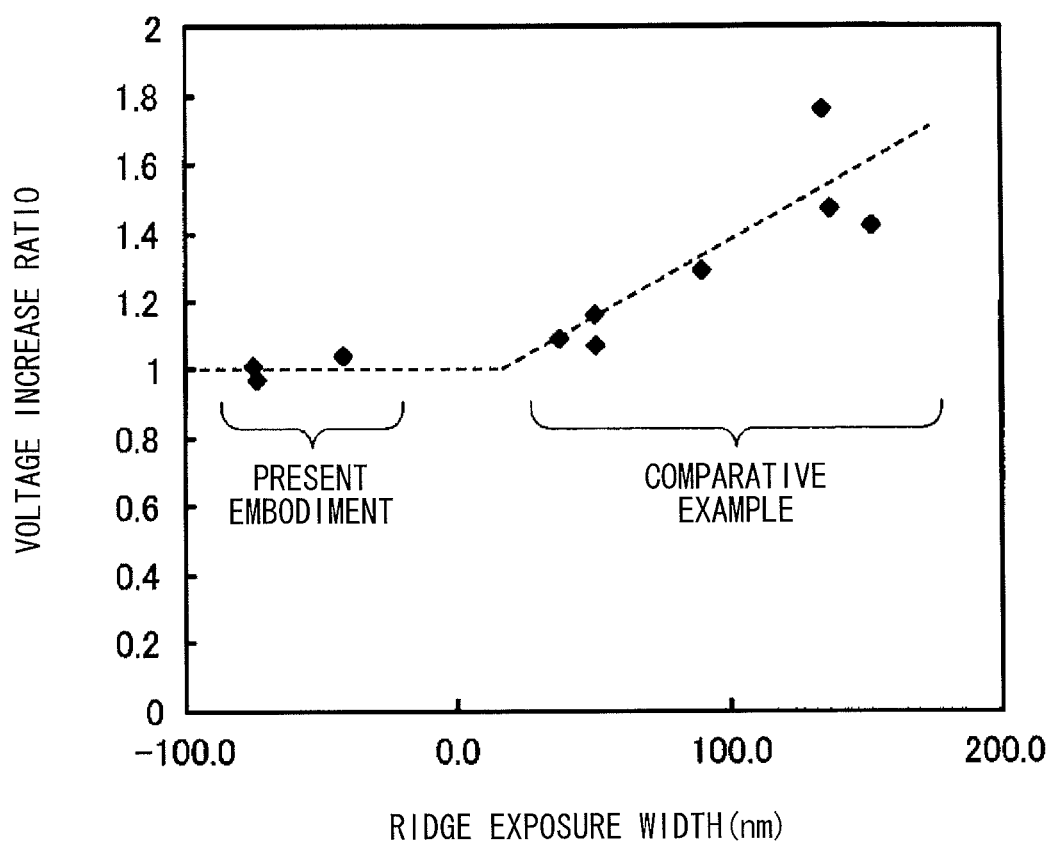
FIG. 7 is a diagram illustrating an experimental result of measuring a voltage degradation ratio with respect to an exposure width of a ridge section.

FIG. 7 illustrates an experimental result of measuring a voltage degradation ratio with respect to an exposure width of the ridge section of the epitaxial layer. The horizontal axis indicates the exposure width (nm) of the ridge section, and the vertical axis indicates a voltage increase ratio. Here, when the height of the insulating layer reaches the surface of the epitaxial layer, the exposure width of the ridge section in the horizontal axis is set to be 0. Cases where the exposure width in the horizontal axis is in the positive value range correspond to the comparative example, and cases where the exposure width in the horizontal axis is in the negative value range correspond to this embodiment. That is, a value obtained by changing the sign of a value in the case in which the exposure value is smaller than 0 in FIG. 7 to positive sign is a value corresponding to coverage length L1 in FIG. 4.

Further, the voltage increase ratio is a increase ratio of a forward voltage. The voltage increase ratio is obtained by flowing a current three times for the respective devices, and finding a ratio between a voltage value at 100 mA when a current is flown for the first time and a voltage value at 100 mA when a current is flown for the third time. That is, the voltage increase ratio represents the voltage value (the third time)/the voltage value (the first time).

It is found that, in the laser diode device of the comparative example in which part of the epitaxial layer is not covered with the insulting layer and is exposed, as the exposure width is increased, the voltage increase ratio is also increased. From the foregoing result, it has been found that exposure of the epitaxial layer causes voltage increase. One of the causes of such voltage increase in the comparative example may be drastic progression of degradation due to direct contact between the epitaxial layer formed on the semi-polar surface and the pad electrode.

Further, in the step shown in step S7 of FIG. 5, in particular, in the case where dry etching is used, if the coating of the epitaxial layer with the insulating layer is not sufficient, etching damage may occur in the epitaxial layer. This may be one of the causes of the voltage increase. Further, such voltage increase is specific to the laser diode device using a semi-polar surface.

On the other hand, it can be seen that, in the laser diode device 1 according to this embodiment in which the coverage range with the insulating layer 12 extends to the side surfaces of the first electrode, the voltage increase ratio is approximately 1, and the third time voltage value is not changed from the first time voltage value. It has been shown that in the laser diode device 1 in which the insulating layer 12 is formed to continuously extend from the epitaxial layer 2 to the side surfaces of the first electrode 14, and the epitaxial layer 2 is not in direct contact with the pad electrode 13 as in this embodiment, voltage increase is suppressed.

As described above, in this disclosure, in the laser diode device having the ridge structure formed by crystal growth on the semi-polar surface of the semiconductor substrate, the insulting layer covering the surface of the epitaxial layer is formed to cover part or all of the first electrode from the epitaxial layer. Thereby, device degradation associated with voltage increase is allowed to be suppressed.

In this embodiment described above, as illustrated in FIG. 4, the insulating layer 12 covers part of the side surfaces of the first electrode 14. However, the insulating layer 12 may cover all of the side surfaces of the first electrode 14. That is, as long as the side surfaces of the epitaxial layer 2 are entirely covered with the insulating layer 12, various changes may be adopted.

[Modification]

Figure 8:
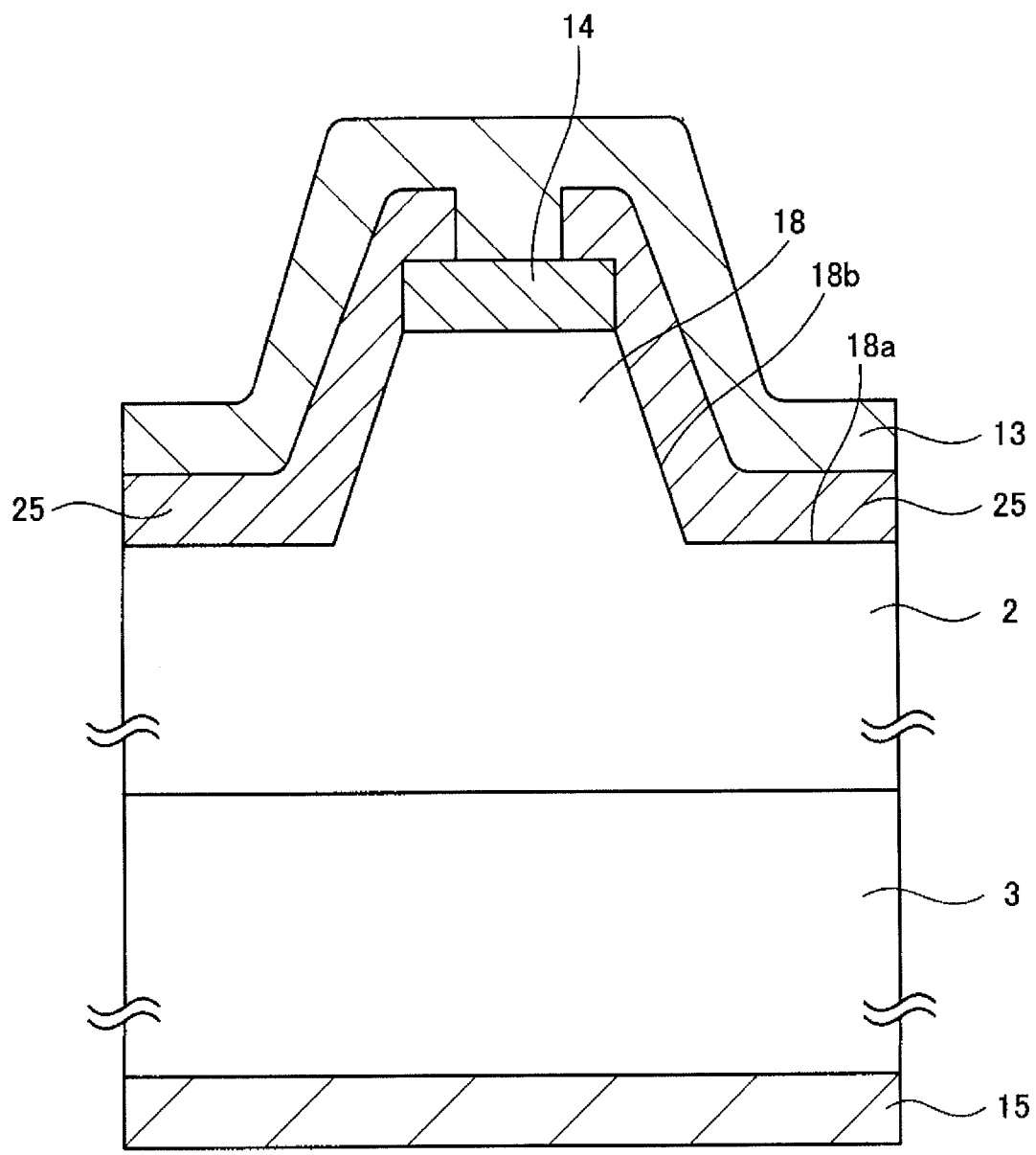
FIG. 8 is a schematic cross-sectional configuration view of a laser diode device according to a modification.

FIG. 8 illustrates a cross-sectional configuration of a laser diode device according to a modification. In FIG. 8, for sections corresponding to those in FIG. 4, the same referential symbols are affixed thereto, and redundant descriptions will be omitted. Further, since the specific configuration of the epitaxial layer 2 in FIG. 8 is similar to that of FIG. 4, the configuration is not illustrated in the figure.

In a laser diode device 24 according to the modification, an insulating layer 25 covering the surface of the epitaxial layer 2 is formed to extend over part of the first electrode 14. That is, in the modification, part of the central region of the first electrode 14 is in contact with the pad electrode 13.

Such a laser diode device 24 may be formed by etching the insulating material layer 19 so that part of the central region of the first electrode 14 is exposed in the step of etching the insulating layer (step S7) illustrated in FIG. 6F and FIG. 6G. In this case, for example, the width in the direction, of the opening section 20a of the resist film 20 illustrated in FIG. 6F, perpendicular to the extension direction of the ridge section 18 is formed to be narrower than the width of the first electrode 14, and the insulating material layer 19 is etched.

As described above, as long as the first electrode 14 is electrically connected to the pad electrode 13, the insulating layer 25 may be formed to extend over part of the top surface of the first electrode 14. As illustrated in FIG. 8, by adopting the configuration in which the insulating layer 25 is formed to extend over the top surface of the first electrode 14, the side surfaces of the epitaxial layer 2 are securely covered with the insulating layer 25, and reliability is allowed to be improved.

Further, in this embodiment described above, as illustrated in the step in FIG. 6D, after the first electrode 14 is formed, etching is performed by using the first electrode 14 as a mask, and the ridge section 18 is formed. However, applicable configurations are not limited thereto, and the first electrode may be formed after the ridge section is formed. In this case, the ridge section is formed through a desired mask, and the first electrode is subsequently formed so that the conductive film remains on only the top surface of the ridge section by a liftoff method.

Further, in this embodiment described above, the n-type semiconductor substrate is used as an example. Alternatively, a p-type semiconductor substrate may be used. In this case, for respective layers, inversed conductive type may be used in the foregoing embodiment. In this case, effects similar to those of the present disclosure are obtainable. Further, the laser diode device according to the present disclosure is not limited to the foregoing embodiment, and various modifications may be made within the spirit of the present disclosure.

It is possible to achieve at least the following configurations from the above-described exemplary embodiment and the modification of the disclosure.

(1) A laser diode device including:
a semiconductor substrate including a semi-polar surface, the semiconductor substrate being formed of a hexagonal III-nitride semiconductor;
an epitaxial layer including a light emitting layer, the epitaxial layer being formed on the semi-polar surface of the semiconductor substrate, and the epitaxial layer including a ridge section;
a first electrode formed on a top surface of the ridge section;
an insulating layer covering the epitaxial layer in an adjacent region of the ridge section and a side surface of the ridge section, the insulating layer covering part or all of side surfaces of the first electrode continuously from the epitaxial layer;
a pad electrode formed to cover a top surface of the first electrode and the insulating layer, the pad electrode being electrically connected to the first electrode; and
a second electrode formed on a surface, of the semiconductor substrate, opposite to the semi-polar surface.

(2) The laser diode device according to (1), wherein the insulating layer is configured of an insulating material including one or more of $SiO_2$, $SiN$, $Al_2O_3$, and $ZrO_2$.

(3) The laser diode device according to (1) or (2), wherein an end surface on a first electrode side of the insulating layer is positioned not to reach the top surface of the first electrode.

(4) A method of manufacturing a laser diode device, the method including:
preparing a semiconductor substrate including a semi-polar surface, the semiconductor substrate being formed of a hexagonal III-nitride semiconductor;
forming an epitaxial layer on the semi-polar surface of the semiconductor substrate, the epitaxial layer including a light emitting layer of the laser diode device;
etching the epitaxial layer to a predetermined depth thereof through a mask, and forming a ridge section in a shape of a stripe;
forming a first electrode in a region corresponding to the ridge section before the forming of the ridge section, or forming the first electrode on a top surface of the ridge section after the forming of the ridge section;
forming an insulating material layer on a surface of the epitaxial layer including a top surface of the first electrode;
etching the insulating material layer, and thereby forming an insulating layer, the insulating layer covering the epitaxial layer in an adjacent region of the ridge section and a side surface of the ridge section, and the insulating layer covering part or all of side surfaces of the first electrode continuously from the epitaxial layer;
forming a pad electrode, the pad electrode covering a top surface of the first electrode and the insulating layer, the pad electrode being electrically connected to the first electrode; and
forming a second electrode on a surface, of the semiconductor substrate, opposite to the semi-polar surface.

(5) The method of manufacturing a laser diode device according to (4), wherein the first electrode is formed before the forming of the ridge section, and the ridge section is formed by etching with use of the first electrode as the mask.

(6) The method of manufacturing a laser diode device according to (4) or (5), wherein
the etching of the insulating material layer is performed by using a resist film including an opening section as a mask, the opening section having a size with which the insulating material layer formed on the top surface of the first electrode is exposed and the insulating material layer formed on a top surface of the adjacent region of the ridge section is not exposed.

(7) The method of manufacturing a laser diode device according to any one of (4) to (6), wherein
the etching of the insulating material layer is stopped after the top surface of the first electrode is exposed and before the epitaxial layer is exposed.
(8) The method of manufacturing a laser diode device according to any one of (4) to (7), wherein the insulating layer is formed of an insulating material including one or more of $SiO_2$, SiN, $Al_2O_3$, and $ZrO_2$.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A laser diode device comprising:
    a semiconductor substrate including a semi-polar surface, the semiconductor substrate being formed of a hexagonal III-nitride semiconductor;
    an epitaxial layer including a light emitting layer, the epitaxial layer being formed on the semi-polar surface of the semiconductor substrate, and the epitaxial layer including a ridge section;
    a first electrode formed on a top surface of the ridge section;
    an insulating layer covering the epitaxial layer in an adjacent region of the ridge section and a side surface of the ridge section, the insulating layer covering part or all of side surfaces of the first electrode continuously from the epitaxial layer;
    a pad electrode formed to cover a top surface of the first electrode, at least a part of side surface of the first electrode and the insulating layer, the pad electrode being electrically connected to the first electrode; and
    a second electrode formed on a surface, of the semiconductor substrate, opposite to the semi-polar surface.

2. The laser diode device according to claim 1, wherein the insulating layer is configured of an insulating material including one or more of $SiO_2$, SiN, $Al_2O_3$, and $ZrO_2$.

3. The laser diode device according to claim 2, wherein an end surface on a first electrode side of the insulating layer is positioned not to reach the top surface of the first electrode.

* * * * *